(12) United States Patent
Toh et al.

(10) Patent No.: US 8,155,609 B2
(45) Date of Patent: Apr. 10, 2012

(54) SWITCH-ABLE BAND-TRACKING INPUT FILTER FOR COMBINATION TUNER

(75) Inventors: Yeow T. Toh, Singapore (SG); Kam C. Kwong, Singapore (SG)

(73) Assignee: NXP B.V., Eindhoven (NL)

( * ) Notice: Subject to any disclaimer, the term of this patent is extended or adjusted under 35 U.S.C. 154(b) by 764 days.

(21) Appl. No.: 11/574,972

(22) PCT Filed: Sep. 2, 2005

(86) PCT No.: PCT/IB2005/052881
§ 371 (c)(1),
(2), (4) Date: Mar. 11, 2009

(87) PCT Pub. No.: WO2006/027733
PCT Pub. Date: Mar. 16, 2006

(65) Prior Publication Data
US 2009/0215415 A1  Aug. 27, 2009

(30) Foreign Application Priority Data
Sep. 8, 2004 (EP) ...................................... 04300584

(51) Int. Cl.
*H04B 1/18* (2006.01)
(52) U.S. Cl. ............... 455/191.1; 455/188.1; 455/191.2; 348/729; 348/731
(58) Field of Classification Search .................. 455/424, 455/425, 456.5, 456.6, 561, 550.1, 575.1, 455/132, 180.1, 180.4, 168.1, 296, 125, 188.1, 455/188.2, 191.1, 191.2; 348/729, 731, 732; 375/350, 136, 146, 147, 349
See application file for complete search history.

(56) References Cited

U.S. PATENT DOCUMENTS

| | | | | |
|---|---|---|---|---|
| 3,646,450 | A | * | 2/1972 | Ma .............................. 455/180.4 |
| 4,002,986 | A | * | 1/1977 | Ma .............................. 455/180.1 |
| 5,978,663 | A | * | 11/1999 | Yamamoto .................. 455/193.2 |
| 6,044,251 | A | | 3/2000 | Brekelmans |
| 6,125,269 | A | * | 9/2000 | Brekelmans ............... 455/180.1 |
| 6,351,294 | B1 | * | 2/2002 | Yamamoto et al. ........... 348/731 |
| 6,483,552 | B1 | * | 11/2002 | Yamamoto .................... 348/729 |
| 6,577,688 | B1 | * | 6/2003 | Nease ........................... 375/350 |
| 6,681,102 | B1 | * | 1/2004 | Collier et al. ................. 455/296 |
| 6,731,349 | B1 | * | 5/2004 | Van Der Wijst .............. 348/732 |
| 6,795,128 | B2 | * | 9/2004 | Yamamoto .................... 348/729 |

(Continued)

FOREIGN PATENT DOCUMENTS

GB          359660 A    10/1931

*Primary Examiner* — Duc Nguyen
*Assistant Examiner* — Charles Chow

(57) ABSTRACT

The present invention relates to a combination RF tuner capable of receiving signals from the FM radio band and from the TV band. Prior art combination tuners had to compromise in quality resulting in combination tuners that neither exhibited high-end FM nor TV-signal reception behavior. A combination RF tuner capable of optimal receiving an FM-radio signal type and a TV signal type, comprising a switch-able tuned input filter (440), is proposed. One response of the input filter (440) provides a sufficient big bandwidth for enabling reception of the TV-signal type. The input filter (440) of the invention can be switched, providing a second response that has a smaller bandwidth for enabling reception of the FM-radio signal type. The second response can be realized by substantially bypassing an 10 inductive element (450) (e.g., comprising a inductor, L21, in series with a damping resistor, R3) of the input filter (440).

10 Claims, 3 Drawing Sheets

U.S. PATENT DOCUMENTS

| | | | |
|---|---|---|---|
| 6,842,094 B2 * | 1/2005 | Hohmann | 334/15 |
| 7,184,733 B2 * | 2/2007 | Asayama et al. | 455/260 |
| 7,227,591 B2 * | 6/2007 | Hwang et al. | 348/729 |
| 7,418,247 B2 * | 8/2008 | Asayama et al. | 455/168.1 |
| 7,567,784 B2 * | 7/2009 | Choi | 455/132 |
| 7,620,379 B2 * | 11/2009 | Isaac et al. | 455/130 |
| 2002/0003585 A1 | 1/2002 | Yamamoto | |
| 2004/0207565 A1 * | 10/2004 | Hibino et al. | 343/860 |

* cited by examiner

SWITCH-ABLE BAND-TRACKING INPUT FILTER FOR COMBINATION TUNER

FIELD OF THE INVENTION

The invention relates to an RF tuner for receiving reception signals of a first type, for example, TV signals, and reception signals of a second type, for example, FM-radio signals. The invention also relates to a multimedia apparatus incorporating such a receiver.

Moreover, the invention relates to an RF (Radio Frequency) input circuit provided with a switch-able RF input filter in order to receive different parts of the RF band. The present invention provided a higher selectivity and sensitivity with a good image rejection and allows further miniaturization of a combination tuner module.

The present invention is particularly relevant for a multimedia TV and FM-tuner combination modules and apparatus using them. The multimedia apparatus may be in the form of a personal computer (PC) having slots into which add-on cards are plugged. The receiver may be implemented on one of these add-on cards. Accordingly, the PC can access information transmitted by FM-radio and TV stations.

BACKGROUND OF THE INVENTION

A receiver capable of receiving TV and FM-radio signals is described in U.S. Pat. No. 5,148,280. The prior-art receiver comprises a single tuner for both TV and FM-radio reception. The single tuner frequency converts both a selected FM-radio signal and a selected TV signal to a fixed intermediate frequency (IF) signal of approximately 40 MHz. An IF of approximately 40 MHz is common for TV reception.

The IF signal produced by the tuner is processed differently for TV or FM-radio reception. For TV reception, the IF signal is processed in a manner which is very similar to IF signal processing in most present-day TV receivers. The IF signal is applied to a TV IF demodulation unit via a surface acoustic wave (SAW) filter. The TV IF demodulation unit provides a base-band composite video signal and a TV sound carrier signal. The TV sound carrier signal is further processed in a TV sound channel, which provides, in response, base-band audio signals.

For FM reception, the IF signal is supplied to a single chip FM-radio integrated circuit (IC) via a filter unit which includes a 43.3 MHz band-pass filter and a 48.65 MHz trap. In the FM-radio IC, the IF signal is frequency-converted to obtain a nominal 10.7 MHz FM IF signal. The FM IF signal is filtered by a ceramic filter arrangement and amplified, detected and decoded in the FM-radio IC. Thus, for FM reception, the prior-art receiver employs a double conversion scheme. The tuner performs a first frequency conversion and the FM-radio IC performs a second frequency conversion.

The filter unit, which is coupled between the tuner and the FM-radio IC, has to satisfy relatively strict requirements in order to avoid excessive distortion of the FM-radio signal to be received. First, the pass-band of the filter unit needs to be sufficiently close to 43.3 MHz. This requirement follows, among other things, from the frequency characteristic of the tuner, which is haystack-like, and the characteristics of the signals to be received. Secondly, the 46.85 MHz trap included in the filter unit needs to be accurately tuned to that frequency so as to avoid an image reception problem in the second frequency conversion.

Although the receiver described in U.S. Pat. No. 5,148,280 uses a single tuner for both TV and FM-radio reception, implementations of the prior-art receiver will be relatively spacious. The filter unit, which is coupled between the tuner and the FM-radio IC, is built up with discrete capacitors and inductors. In order that the filter unit satisfies the above-described requirements, the inductors need to have a certain size. If not, the inductors will have a too low quality factor to achieve an adequate selectivity and accuracy.

A more recent state of the art 'FM+TV radio in one concept' input section, similar to as the one described in U.S. Pat. No. 6,125,269 has typically two switching elements, apart from a possible antenna input switching using switching diodes. First, an oscillator is switched to a lower IF (10.7 MHz), and second, a band-pass-filter is switched from a TV band-pass of ~10 MHz bandwidth to a lower 2 MHz bandwidth. The input-signal itself however is not switched. Selectivity and image rejection is achieved in the band-pass filter and augmented by two traps at the input for two specific frequencies in order to, e.g., fulfill CENELEC. The bandwidth of an FM channel is however only 200 kHz compared with a TV channel in VHF of either 6,7 or 8 MHz.

FIG. 1 illustrates a block-diagram of a current state of the art combined FM-input and TV VHF low band input.

FIG. 2 illustrates an equivalent circuit for the FM-radio input and TV-VHF-low-input, however eliminating switching diodes (switch 130 in FIG. 1) that are necessary for isolating between TV VHF-low input and FM-radio input. The two traps behind the FM-antenna input terminal (tuned at 119 MHz and 130 MHz) attempt to provide sufficient image rejection for the FM radio channels. The Mosfet amplifier 150 and the tuned filters 160 and 170 behind the Mosfet amplifier of FIG. 1 are not shown in FIG. 2.

FIG. 3 shows a typical response of a TV VHF-low band filter for the FM antenna.

An FM-concept in an RF tuner capable of receiving TV and FM-radio signals of the prior art have a poor selectivity due to band-with of mentioned filters and a used damping resistor. The poor selectivity can in turn cause oscillator radiation at the FM-antenna input terminal. The FM-input traps provide only a poor image rejection.

SUMMARY OF THE INVENTION

It is, accordingly, an object of the present invention to provide an improved input section an RF tuner capable of receiving TV and FM-radio signals.

It is another object of the invention to provide an input section for an RF tuner capable of receiving TV and FM-radio signals with an improved selectivity, a better image rejection for FM and little oscillator at the FM antenna terminal.

It is yet another object of the invention to provide an apparatus for receiving TV and FM-radio signals with an improved selectivity, a better image rejection for FM and little oscillator at the FM antenna terminal.

In one embodiment, a switch-able coil damping resistor combination has been added in a shared part for the TV and FM input section that enables to control signal bandwidth depending on whether a TV-input signal or an FM-input signal is selected.

In another embodiment a combination RF tuner capable of receiving an FM-radio signal type and a TV signal type, the tuner comprising a switch-able tuned input filter (440), is proposed. One response of the input filter (440) provides a sufficient big bandwidth for enabling reception of the TV-signal type. The input filter (440) can be switched providing a second response that has a smaller bandwidth for enabling reception of the FM-radio signal type. The second response can be realized by substantially bypassing an inductive element (450) of the input filter (440).

These and other aspects of the invention will be apparent from and will be elucidated with reference to the embodiments described hereinafter.

BRIEF DESCRIPTION OF THE DRAWINGS

The present invention will now be described in more detail, by way of example, with reference to the accompanying drawings, wherein.

Throughout the drawings, the same reference numeral refers to the same element, or an element that performs substantially the same function.

DETAILED DESCRIPTION OF THE INVENTION

Figure 1:
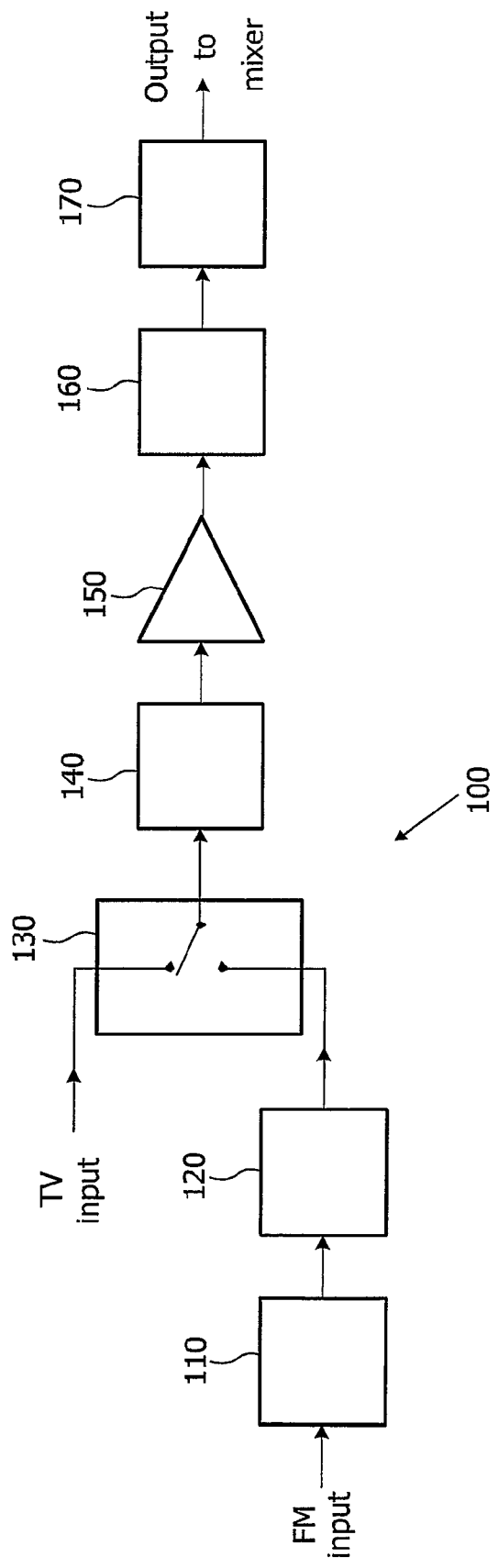
FIG. 1 shows a block diagram of a prior art FM-input and TV VHF low band input section.

FIG. 1 shows a block diagram of a prior art FM-input and TV VHF low band input section. FIG. 1 comprises an FM signal input terminal, a TV signal input terminal, an output to a mixer stage, a first trap 110, a second trap 120, a FM/TV selection switch 130, a first tuner filter 140, a Mosfet amplifier 150, a second tuner filter 160 and a third tuner filter 170. The first trap and the second trap comprise trap for FM image signal rejections that can occur substantially at frequencies of 119 MHz and 130 MHz.

Figure 2:
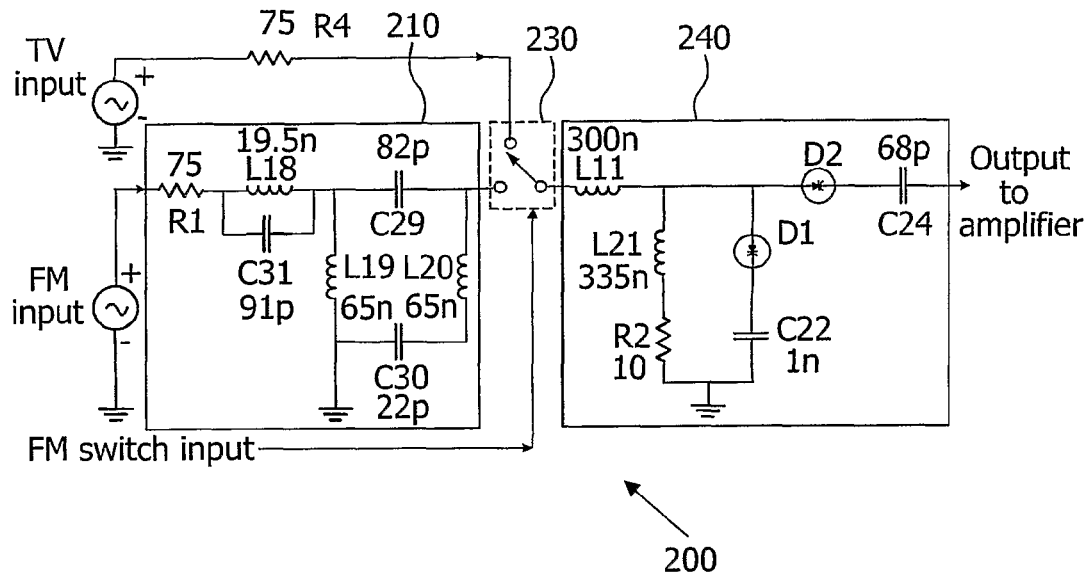
FIG. 2 shows a circuit diagram of a prior art FM-input and TV VHF low band input section.

FIG. 2 shows a circuit 200 of a prior art FM-input and TV VHF low band input section. FIG. 2 comprises a circuit diagram including an FM signal input terminal, two traps for an image rejection circuit 210 (equivalent to traps 110 and 120 of FIG. 1), a TV signal input terminal, an FM/TV selection switch 230, a shared input filter 240 for FM radio and TV VHF low band (equivalent to the first tuned filter 140 of FIG. 1) and an output terminal the a Mosfet amplifier. The shared input filter 240 can be tuned using variable capacitive diodes D1 and D2. Filter 240 includes a damping resistor R2 that is needed only for reception of TV VHF low band signals. Damping resistor R2 actually prevents a control of return loss for FM signals of a large bandwidth. The FM/TV selection switch 230 selects an RF input signal coming from either the FM input or from the TV input and provides an isolation between the two inputs.

Figure 3:
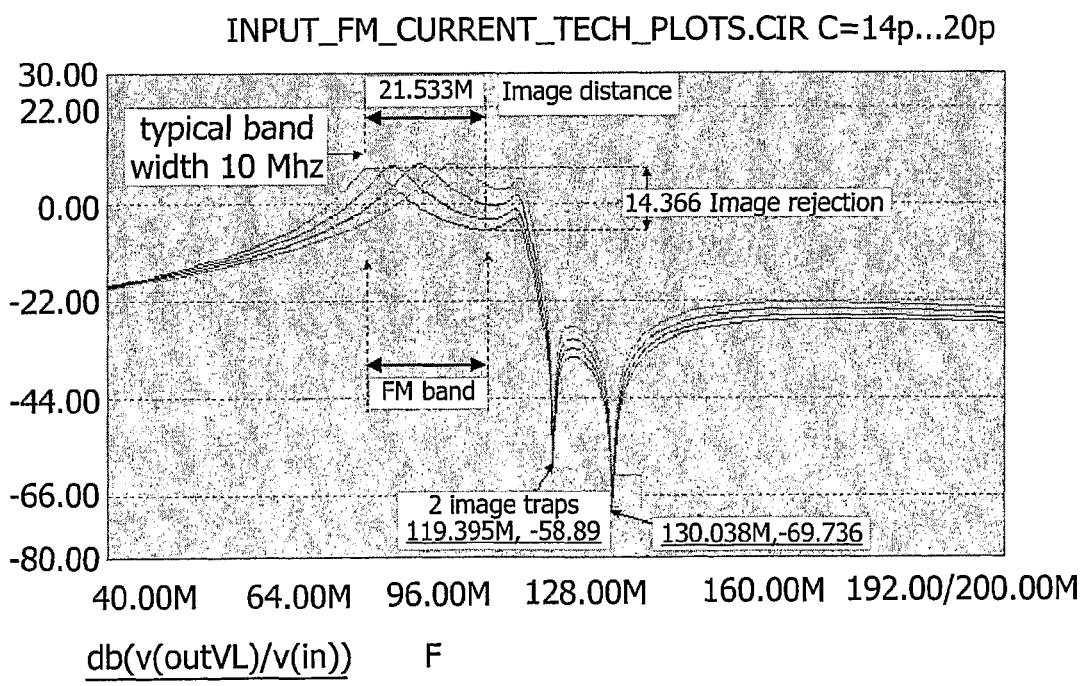
FIG. 3 shows a typical response of a prior art TV VHF-low band filter for the FM antenna.

FIG. 3 shows a typical response 300 of a prior art TV VHF-low band filter for the FM antenna using the circuit 200 of FIG. 2. It can be seen that an image rejection of about 14.4 dB can be achieved with circuit 200 for the FM-band ranging from about 87~108 MHz. It is also shown in response 300 that circuit 200 provides a typical bandwidth for receiving FM signals of about 10 MHz, which is more than needed.

Figure 4:
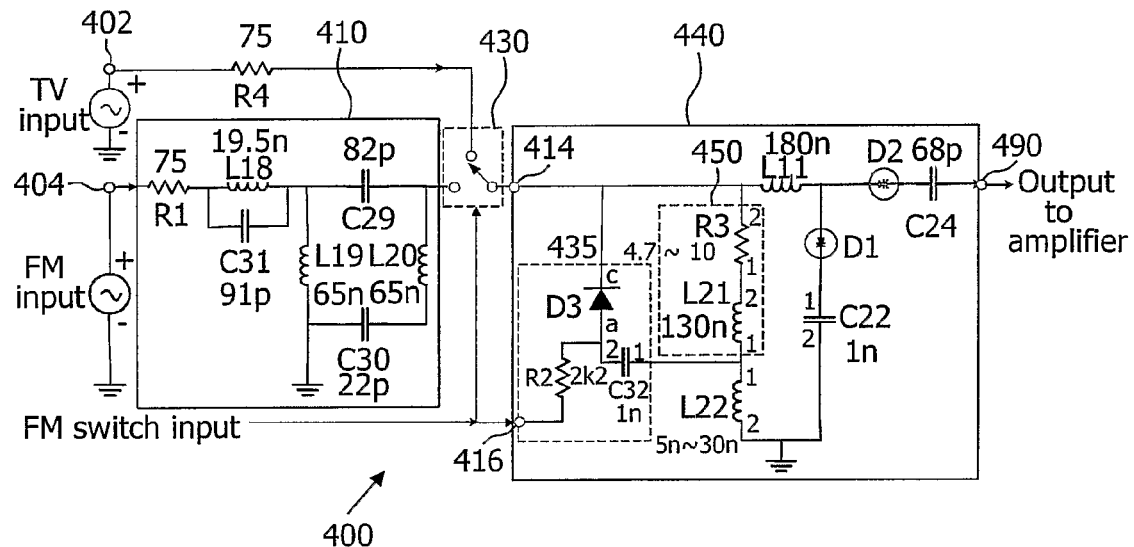
FIG. 4 shows a circuit diagram of an improved circuit for a combined FM-input and TV VHF low band input section in accordance with the invention.

One embodiment of the invention comprises an introduction of a new bandwidth control element (e.g., using a coil) while at the same time removing the damping element R2 in FM-band reception mode to control the return loss over a much larger required bandwidth. Damping resistor R2 is typically required for TV-VHF-low band reception. FIG. 4 shows a practical implementation of such an embodiment.

FIG. 4 shows a circuit diagram of an improved circuit for a combined FM-input and TV VHF low band input section 400 in accordance with the invention. FIG. 4 comprises a circuit diagram including an FM signal input terminal, two traps for an image rejection circuit 410 (similar to traps 110 and 120 of FIG. 1), a TV signal input terminal, an FM signal input terminal, an FM/TV selection switch 430, a (TV-VHF-low band and FM-radio band) shared input filter 440 for FM radio and TV VHF low band (improved from and replacing the first tuned filter 140 of FIG. 1), an FM switch input terminal and an output terminal to a Mosfet amplifier. The shared input filter 440 comprises FM filter switch 435, inductive element 450, inductors L11 and L22, capacitors C22 and C24, Capacitive diodes D1 and D2. Shared input filter 440 can be tuned using variable capacitive diodes D1 and D2. FM/TV selection switch 430 comprises diode D3, resistor R2 and capacitor C32. The FM/TV selection switch 430 selects an RF input signal coming from either the FM input (down position) or from the TV input (up position) and provides an adequate isolation between the two inputs. In a typical embodiment a (pin-) diode-based switch can be used as, e.g., described in pending patent application "RF selection switch for multiple Antenna input" attorney docket PHFR040144 (priority date: 25 Aug. 2004).

Now follows a description for the situation when a FM signal is offered (switch 430 in down position) and needs to be processed by input section 400. A high potential will be offered to the FM switch input terminal. This causes diode D3 to become conductive (including for RF signals) as D3's anode becomes positive and D3's cathode is substantially connected to ground via the inductive element 450 (comprising a small resistor R3, typically used for damping, in series with coil L21) and coil L22. Capacitor C32 is relative big and blocks the high potential but substantially is a pass-through for RF signals of the FM band. So in effect the inductive element 450 is short-cut for relevant (FM) RF signals. Doing so, a high selectivity and sensitivity is achieved for the FM radio input. The remaining element coil L22 achieves a high FM-band signal selectivity. Coil L22 can be 5 nH up to 30 nH depending on practical tracking issues such as on a practical issue as to compromise between bandwidth and input filter-oscillator tracking. Resistor R3 can be as high as 10 Ohms depending on the receiving system. Obviously various modifications can be made to input selection 400 while still in the spirit of the invention. For instance, resistor R3 and coil L21 can be swapped from place.

Now follows a description for the situation when a TV VHF low signal is offered (switch 430 in up position) and needs to be processed by input section 400. For TV mode the FM switch input terminal is set to a low potential putting diode D3 in a non-conductive state (including for RF signals). A TV input signal will be able to experience wide bandwidth with total inductance of the sum coils L21 and L22 amounting 160 nH (130+30). This is inconsequential since the effect on the bandwidth in total is very minimal. This increase in inductance and its effect on the selectivity can be negated by a corresponding change in resistor R3.

Figure 5:
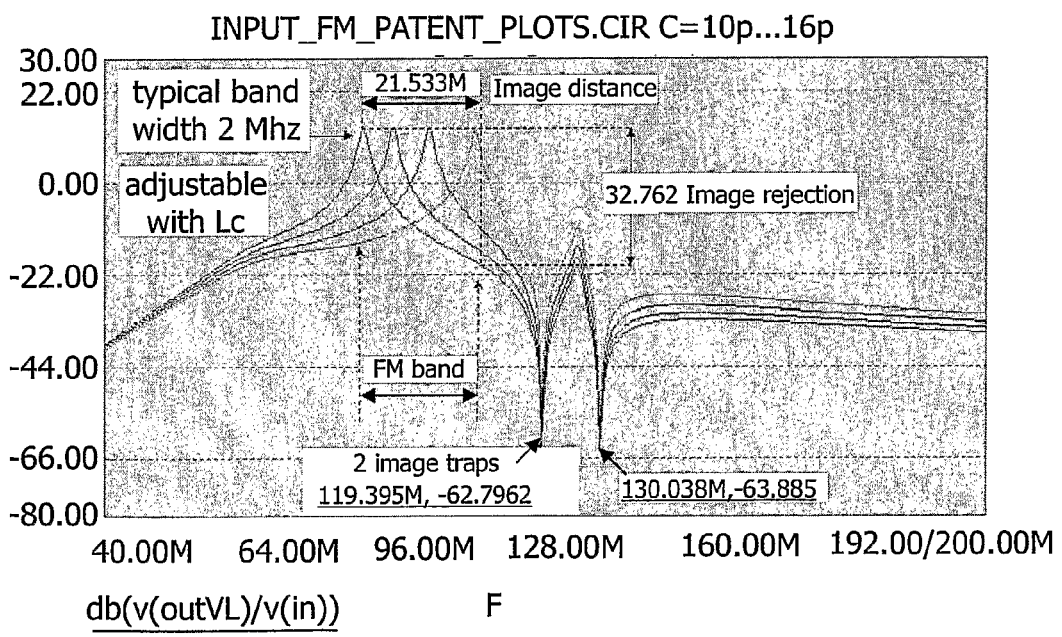
FIG. 5 shows a shows a response of the improved combined FM-input and TV VHF-low band filter for the FM antenna.

FIG. 5 shows a shows a response of the improved combined FM-input and TV VHF-low band filter for an FM-radio-band signal, using the circuitry as described by FIG. 4. It can easily be seen from FIG. 4 that the image rejection has become more than 32.7 dB, and that the input filter selectivity has become more selective and that FM-input signal will show more signal gain. Some of the resulting improvements for FM-band signal reception can be quantified as follows:

Ratio of input filter selectivity (10 MHz/2 MHz): five fold improvement;

Image rejection changes (32.76−14.36 dB)=18.4 dB improvement throughout; and

Typically a +3 to +5 dB more signal gain.

One of ordinary skill in the art will recognize that alternative schemes can be devised of designing a switch-able band-tracking filter. For instance, alternative component arrangements can be derived that perform with substantial similar filter characteristics of the one shown in this invention. The invention is also useful for other than FM and TV combination tuners, e.g., cable-modem with TV tuner, cable-modem with FM-tuner, analogue $ digital TV tuner with FM tuner etc.

The foregoing merely illustrates the principles of the invention. It will thus be appreciated that those skilled in the art will be able to devise various arrangements which, although not explicitly described or shown herein, embody the principles of the invention and are thus within its spirit and scope. Also one skilled in the art understands that certain components, such as coupling or decoupling capacitors can be added or deleted, depending on a design beyond the switching circuitry or certain design and performance criteria.

The invention claimed is:

1. An RF tuner for receiving reception signals of a first type and a second type, the tuner comprising:
 a switch-able tuned input filter that can be switched in response to input of a first reception signal of the first type and to input of a second reception signal of the second type, wherein the input filter comprises:
  an RF signal input terminal configured to receive the first reception signal or the second reception signal;
  an RF signal output terminal;
  a switch;
  a first tune-able part that includes a first capacitor in series with a variable capacitor, wherein the first capacitor is connected to the RF signal input terminal through the variable capacitor; and
  a second part that includes a first coil and an inductive element, wherein the first leg of the first coil is connected to the first leg of the inductive element,
 wherein the switch can substantially RF shortcut the inductive element by switching a substantially large second capacitor in parallel with the inductive element,
 wherein the inductive element comprises a second coil, and wherein the first leg of the second capacitor is connected to the connection of the first leg of the first coil and the first leg of the inductive element and wherein the switch comprises:
  a diode connected by the anode of the diode to the second leg of the second capacitor and with the cathode of the diode connected to the second leg of the inductive element; and
  an FM switch input connector connected to the anode of the diode and wherein the second leg of the first coil is connected to a low potential, wherein the FM switch input connector is connected to the RF signal input terminal through the diode.

2. The RF tuner of claim 1, wherein a high potential on the FM switch input signal brings the diode in a conducting state that substantially causes reception signals of the first type to bypass the inductive element.

3. The RF tuner of claim 2, wherein the reception signals of the first type comprise FM-radio signals and reception signals of the second type comprise TV VHF low band signals.

4. The RF tuner of claim 1, wherein the inductive element further includes a series-damping resistor, and wherein the second coil is connected to the RF signal input terminal through the series-damping resistor.

5. A multimedia apparatus comprising an RF tuner of claim 1.

6. A combination RF tuner capable of receiving an FM-radio signal type and a TV signal type, the tuner comprising a switch-able tuned input filter, wherein a second response of the input filter provides a sufficient big bandwidth for reception of the TV-signal type and wherein the filter can be switched providing a first response that has a smaller bandwidth for reception of the FM-radio signal type, wherein the first response can be realized by substantially bypassing an inductive element, wherein the switch-able tuned input filter comprises:
 an RF signal input terminal configured to receive the FM-radio signal type or the TV signal type;
 an RF signal output terminal;
 a switch;
 a first tune-able part that includes a first capacitor in series with a variable capacitor, wherein the first capacitor is connected to the RF signal input terminal through the variable capacitor; and
 a second part that includes a first coil and an inductive element, wherein the first leg of the first coil is connected to the first leg of the inductive element,
 wherein the switch can substantially RF shortcut the inductive element by switching a substantially large second capacitor in parallel with the inductive element, and
 wherein the inductive element comprises a second coil, and wherein the first leg of the second capacitor is connected to the connection of the first leg of the first coil and the first leg of the inductive element and wherein the switch comprises:
  a diode connected by the anode of the diode to the second leg of the second capacitor and with the cathode of the diode connected to the second leg of the inductive element; and
  an FM switch input connector connected to the anode of the diode and wherein the second leg of the first coil is connected to a low potential, wherein the FM switch input connector is connected to the RF signal input terminal through the diode.

7. A tuner for receiving a reception signal of a first type and reception signal of a second type, the tuner comprising:
 a first input section comprising a first section input and a first section output, the first input section for providing at least one notch filter;
 a first RF input for coupling the reception signal of the first type to the first section input;
 a second input section comprising a second section input and a second section output, the second input section comprising a switch-able tuned band-pass filter;
 a first switch, switch-able between coupling the first section output to the second section input for receiving the reception signal of the first type; and coupling a second RF input to the second section input, wherein a second response of the second input section provides a sufficient big bandwidth for reception of the signal of the second type and wherein second input section can be switched providing a first response that has a smaller bandwidth for reception of a signal of the first type,
 wherein the switch-able tuned band-pass filter comprises:
  an RF signal input terminal configured to receive the first reception signal or the second reception signal;
  an RF signal output terminal;
  a switch;

a first tune-able part that includes a first capacitor in series with a variable capacitor, wherein the first capacitor is connected to the RF signal input terminal through the variable capacitor; and a second part that includes a first coil and an inductive element, wherein the first leg of the first coil is connected to the first leg of the inductive element, wherein the switch can substantially RF shortcut the inductive element by switching a substantially large second capacitor in parallel with the inductive element, and wherein the inductive element comprises a second coil, and wherein the first leg of the second capacitor is connected to the connection of the first leg of the first coil and the first leg of the inductive element and wherein the switch comprises:

a diode connected by the anode of the diode to the second leg of the second capacitor and with the cathode of the diode connected to the second leg of the inductive element; and an FM switch input connector connected to the anode of the diode and wherein the second leg of the first coil is connected to a low potential, wherein the FM switch input connector is connected to the RF signal input terminal through the diode.

8. The tuner of claim 7, wherein the first response can be realized by substantially bypassing the inductive element.

9. The tuner of claim 7, wherein a reception signal of the first comprises an FM signal and wherein a reception signal of the second comprises a TV signal.

10. A multimedia apparatus comprising a tuner of claim 7.

* * * * *